United States Patent [19]

Miller

[11] 4,454,430

[45] Jun. 12, 1984

[54] UNIVERSAL CONTROL GRID MODULATOR

[75] Inventor: Daniel G. Miller, Randallstown, Md.

[73] Assignee: The United States of America as represented by the Secretary of the Air Force, Washington, D.C.

[21] Appl. No.: 379,807

[22] Filed: May 19, 1982

[51] Int. Cl.³ .................. H03K 5/04; H03K 7/08; H03K 17/687

[52] U.S. Cl. .................... 307/265; 307/246; 307/282; 307/571

[58] Field of Search .......... 307/246, 279, 282, 265, 307/571

[56] References Cited

U.S. PATENT DOCUMENTS

| | | | |
|---|---|---|---|
| 3,798,608 | 3/1974 | Huebner | 307/282 |
| 3,928,809 | 12/1975 | Tschudi et al. | 307/265 |
| 4,002,932 | 1/1977 | Zaslav | 307/314 |
| 4,052,623 | 10/1977 | Loberg | 307/282 |
| 4,140,980 | 2/1979 | Cummings | 332/9 T |
| 4,159,478 | 6/1979 | Jaklitsch et al. | 343/18 E |
| 4,170,740 | 10/1979 | Pernyeszi | 307/246 |
| 4,193,032 | 3/1980 | Milberger et al. | 178/116 |
| 4,425,518 | 1/1984 | Milberger | 307/571 |

Primary Examiner—John S. Heyman
Attorney, Agent, or Firm—Donald J. Singer; Bernard E. Franz

[57] ABSTRACT

High voltage FET's (field effect transistors) are used to modulate a traveling wave tube, which makes it possible to achieve fast rise, fall and delay chracteristics, and very long pulsewidths to CW because of their low drive requirements to maintain the on condition. The low and high voltage portions of the modulator are coupled via special transformers having only one or two turns for each winding on torroidal cores. Since such transformers are not adequate for long pulse widths, the gate to source capacitance of a high voltage FET is charged with a short pulse from one transformer and held there by a blocking diode until it is removed by the off drive. To obtain pulse widths all the way out to CW, a regeneration circuit is incorporated in the low voltage circuitry so that if the commanded on time goes beyond a maximum time, successive pulses are generated to maintain the voltage between gate and source of the on FET.

7 Claims, 5 Drawing Figures

UNIVERSAL CONTROL GRID MODULATOR

RIGHTS OF THE GOVERNMENT

The invention described herein may be manufactured and used by or for the Government of the United States for all governmental purposes without the payment of any royalty.

BACKGROUND OF THE INVENTION

This invention relates to a modulator for control grid modulation of a high voltage electron tube, and more particularly to a universal modulator for electronic countermeasures and radar applications with a wide range of pulse widths.

In electronic countermeasure applications in particular, designers have been striving to achieve a universal modulator with minimal delay plus rise for repeater operation, very short pulse capability for efficient peak power use, and very long pulse to CW capability to allow the source to counter a multitude of different threats.

Present modulators are able to meet the rise plus delay requirements for voltage swings in the order of 350 volts; however, minimum pulsewidths are limited to the 0.5 microsecond range with off plus delays running well beyond 100 nanoseconds. In addition, the maximum pulsewidth is limited to the 50-microsecond range.

For example, U.S. Pat. No. 4,193,032 by Milberger et al discloses apparatus for pulsing a high speed transmitter having pulser delay times in the nanosecond range. The combination of solid state and spark gap devices provides protection against high voltage arcs for both transient and power follow-through conditions.

U.S. Pat. No. 4,159,479, by Jaklitch et al, discloses a radar ECM simulator using PIN modulators, which is a common device for high-speed modulators. U.S. Pat. No. 4,140,980, by Cummings, discloses a compensation circuit for trailing edge distortion of pulsewidth modulated signals.

SUMMARY OF THE INVENTION

The object of this invention is to provide a universal control grid modulator for high voltage electron tubes with minimal delay plus rise for repeater operation, very short pulse capability for efficient peak power use, and very long pulse out to CW (continuous wave) capability.

The modulator according to the invention comprises (1) a high voltage portion which has fast fall and delay characteristics and high voltage capability, using field-effect transistors (FET's), to generate the required pulse; (2) a low-voltage driving portion which provides on and off drive with little delay from the input; and (3) drive transformers to couple the low and high voltage circuits with minimum delays. To provide the fast delay and rise with high isolation voltage, the number of turns is kept very low on the transformers. Low turns means low volt-second capability which means that the transformer will not be adequate for long pulsewidths. This problem is solved by making use of the low drive capability of the FET's. The gate-to-source capacitance is charged with a short pulse from the transformer and is held there by a blocking diode until it is removed by the off drive. This feature allows very long pulses with a low volt-sec capability transformer.

In order to get pulse widths all the way out to CW, a regeneration circuit is incorporated in the low voltage circuitry so that if the commanded on time goes beyond a maximum time, another on pulse will be generated to maintain the voltage between gate and source of the FET. The design of this circuit allows the pulsewidth to extend to the CW condition.

DETAILED DESCRIPTION

Figure 1:
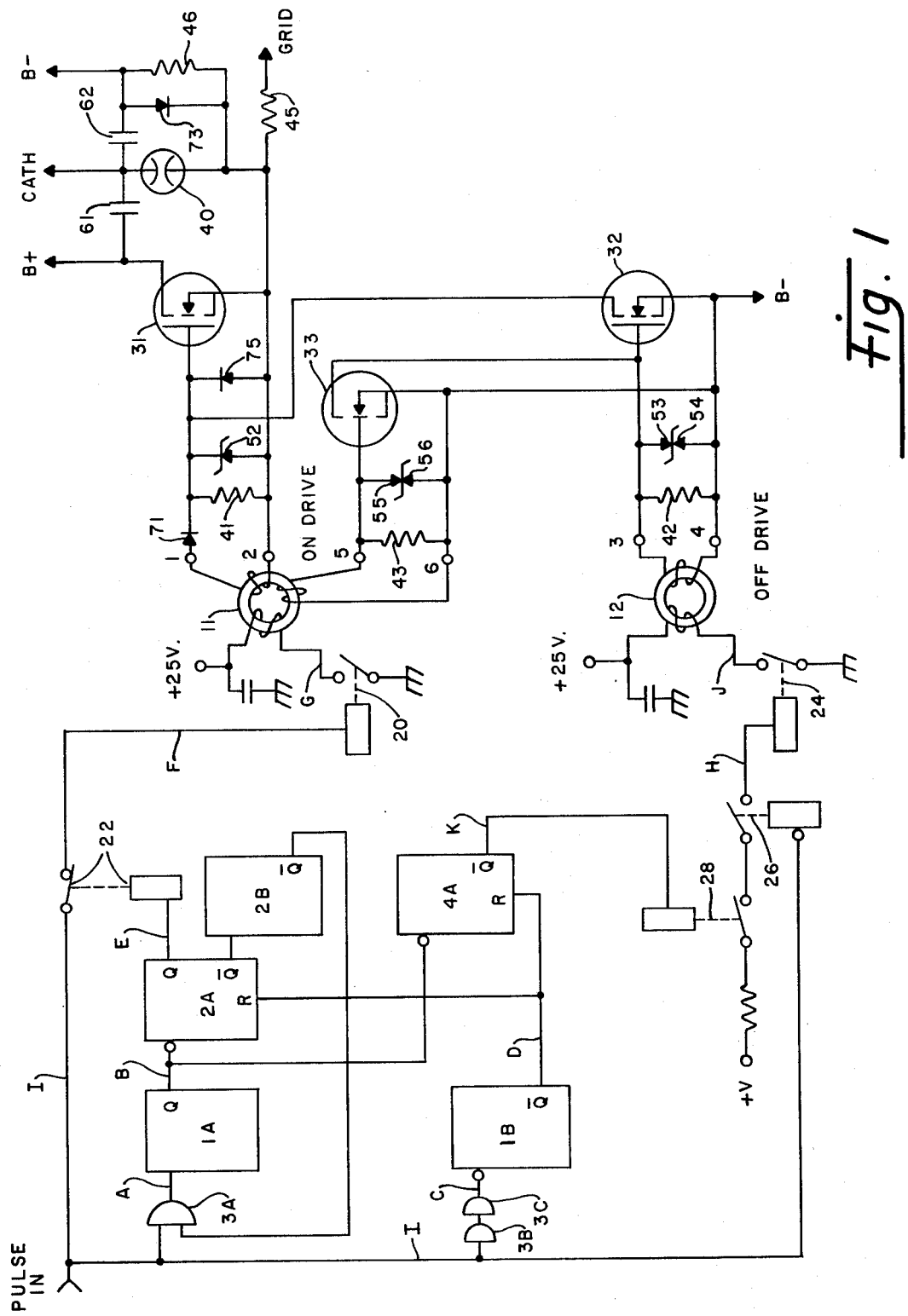
FIG. 1 is a schematic, functional block, and symbolic diagram of a modulator according to the invention.

In the diagram of FIG. 1, the high voltage portion of the modulator is shown at the right, the low voltage driving portion is shown at the left, and the isolation transformers 11 and 12 are in the center.

The high voltage portion supplies control grid modulation to an electron tube, such as a traveling wave type which has a plate voltage of 8,000 to 14,000 volts. The modulator makes use of high voltage FET's (field effect transistors of 400 to 500 volts), which provides very good rise plus delay characteristics when used in conjunction with the other features of the invention. The FET's provide the high impedance drive requirements along with fast turn on and off with minimum delays. FET's are also noted for elimination of storage time common to all bipolar transistors.

An important feature relates to the design of the transformers 11 and 12. These transformers must isolate the cathode voltage of the electron tube from the low voltage boards. The voltage is in the range of 10,000 volts and requires significant insulation to accomplish this. In order to provide the fast delay and rise time with the high isolation voltage, the number of turns must be kept low. Low turns means low volt-second capability which means that the transformer will not be adequate for long pulsewidths. This problem is solved by making use of the low drive capability of the FET's. The gate-to-source capacitance is charged with a short pulse from the transformer and is held there by a blocking diode until it is removed by the off drive.

A specific design for transformers 11 and 12 makes use of torroidal ferrite cores. Both the primary and secondary windings are each number 22 A.W.G. wire of one or two turns, with a one-to-one-turns ratio. The wire for the secondary windings has high voltage silicon insulation.

LOW VOLTAGE

In FIG. 1, the showing of the low voltage portion has been simplified. High speed electronic switching circuits are represented sybolically as relays. In order to get pulsewidths all the way out to CW (continuous wave), a regeneration circuit is incorporated, so that if the commanded on time goes beyond a maximum time, another on pulse will be generated to maintain the voltage between the gate and source of the FET. This is accomplished with one-shot or monostable devices for timing.

The low-voltage portion as shown in FIG. 1 comprises electronic switching circuits represented as relays 20, 22, 24, 26 and 28; one-shot devices 1A, 1B, 2A, 2B and 4A; and gates 3A, 3B and 3C. The pulse input lead I is connected via a normally closed switch 22 to switch 20. Switch 20 completes a path for the primary winding of the on drive transformer 11. The input lead I is connected via gate 3A to the leading edge input of one-shot 1A, and also via gates 3B and 3C to the trailing edge input of one shot 1B. Another connection from input lead I is via an inversion to switch 26. When the input pulse ends switch 26 operates to initiate a pulse from a voltage source and resistor to switch 24, the pulse being terminated by operation of a normally closed switch 28. Switch 24 completes a path for the primary winding of the off-drive transformer 12.

The Q output of one shot 1A is connected to trailing edge inputs of one shots 2A and 4A. The Q output of one-shot 2A is connected to operate switch 22 which terminates the on drive pulse. One shot 2A has a timing period of about 60 microseconds, to provide the principal timing for a regeneration cycle. One-shot 4A has a slightly longer timing period. The $\overline{Q}$ output of one-shot 1B is connected to reset inputs of one-shots 2A and 4A. The $\overline{Q}$ output of one-shot 4A is connected to operate switch 28.

The input pulse drives the output switch 20 directly in order to minimize the delays required to pulse the modulator on. At the same time, the input pulse is fed through the logic to provide a delayed input pulse. This delayed pulse limits the maximum pulse-width to the switch 20 to the propagation delays through the logic circuitry. This total delay is not critical so that the normal variation of delays, because of temperature and normal distribution, do not effect performance. This delayed input pulse will inhibit drive to the switch 20 for 60±10 microseconds or until the input pulse goes away. If 60 μsec is exceeded, the one shot will reset and regenerate another delayed pulse which will last for another 60±10 μsec. The regeneration will continue until the input pulse goes away. During the regeneration time the switch 20 is allowed to operate and provide another burst of on drive to the H.V. portion of the modulator. This keeps the modulator in the on condition.

The off drive is generated in a similar manner. The input pulse, in conjunction with switch 26 prevents drive from getting to the switch 24 until the input pulse has ended. The inverse of the logic delayed pulse drives the switch 28. This provides voltage to switch 24 when the input pulse ends. It should be noted that no drive can reach the switch 24 as long as the input pulse is present. The width of the off pulse is determined by the amount of trailing edge delay in the logic circuitry. Again the total delay is not critical so that normal variation in device delay can be tolerated.

Both the on and the off pulses that are generated are normally about 100 to 200 nanoseconds and, therefore, require a low volt-second capability in the isolation transformers. This is of prime importance in achieving short delay and fast rise transformers.

Figure 2:
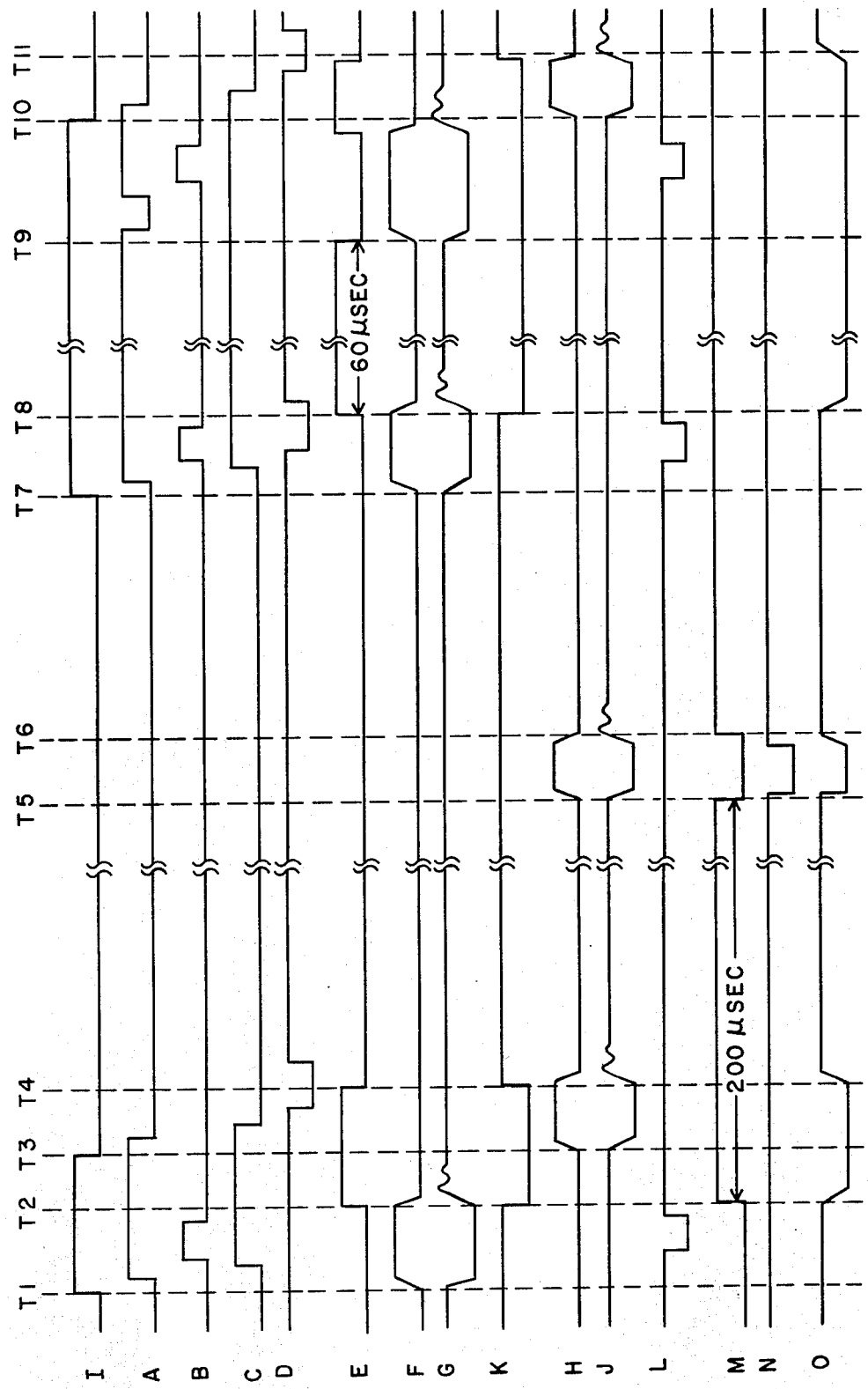
FIGS. 2 and 3 are timing graphs of the low and high voltage portions respectively.

Refer to the timing diagram of FIG. 2 for the detailed operation of the low-voltage circuits. The designations (except L to O) at the left of FIG. 2 refer to leads or signal points shown in FIG. 1. The timing is shown at the left for a short input pulse, and at the right for a long input pulse greater than 60 microseconds.

At time T1 the input pulse at line I commences, and is applied directly to line F. Switch 20 operates to start the on drive pulse at G. At the same time the input pulse with a small delay in gate 3A is supplied to line A. After another slight delay, the one shot 1A is set and its output appears at line B. The timing for this one shot is the minimum for the device, and it resets itself after a short period. The trailing edge at B sets the 60-microsecond one shot 2A, and also sets the one-shot 4A. At time T2, the output of one-shot 2A at line E causes the switch 22 to operate and removes the input pulse from line F. This ends the on drive pulse at G.

At some time T3, the input pulse ends, and via switch 26 causes a pulse to start on line H. Switch 26 operates to start the off drive at line J for the transformer 12. The input pulse after delays in gates 3B and 3C also ends at line C. After a short delay, one shot 1B sets, and its output on line D goes low. One shot 1B is designed to reset itself in the minimum time for the device, and its output at D goes high. This resets one shots 2A and 4A, at time T4, ending the pulses on line E, and causing the signal on line K to go high. The signal on line K operates switch 28, which thereby terminates the signal on line H, and ends the off drive pulse at line J. The signal conditions are all now back to normal, and the circuit is ready for another input pulse.

Another input pulse appears on line I at some indefinite later time T7. During the time interval T7 to T8, the conditions on lines A to G inclusive occur in the same manner as during the time interval T1 to T2. The signal on line G generates an on drive pulse in transformer 11. If the input pulse were to continue, an on drive pulse would continue to be generated every 60 microseconds. Since one shot 4A has a slightly longer timing period than one shot 2B, the signal at line K remains low. Therefore, switch 28 remains closed, and is ready for the generation of an off drive pulse at any time.

At some time T10 the input pulse ends, which operates switch 26 to begin an off drive pulse via line H, switch 24 and line J, in the same manner as at time T3. The signals at lines C, D and K occur in the same manner to terminate the off drive pulse at time T11.

HIGH VOLTAGE

In FIG. 1, the high voltage portion of the modulator comprises high voltage FET's 31 and 32 for on and off control of the grid modulation, and an FET 33 shunted across the input of FET 32.

Transformer 11 has one winding with terminals 1 and 2, with terminal 1 connected via a diode 71 to the gate of FET 31, and terminal 2 connected to the source. Also connected between the base and source of FET 31 are a resistor 41, a voltage regulator 52 and a diode 75. Another winding of transformer 11 has terminals 5 and 6 connected respectively to the gate and source of FET 33, with a resistor 43 and back-to-back voltage regulators 55 and 56 also connected across these terminals. Transformer 12 has a winding with terminals 3 and 4 connected to the base and source respectively of FET 32, with a resistor 42 and back-to-back voltage regulators 55 and 54 also connected across these terminals.

The circuit connected to the traveling wave tube (not shown) includes a capacitor 61 from B+ to the cathode, and a capacitor 62 from the cathode to B−. The B+ terminal is connected to the drain of FET 31. The B− terminal is connected via resistor 46 and diode 73 in parallel to the source of FET 31. The B− terminal is also connected to the source of FET 32. The grid is connected via a resistor 45 to the source of FET 31. A spark gap 40 is connected from the cathode to the source of FET 31.

The drain of FET 32 is connected to the gate of FET 31. The drain and source of FET 33 are connected respectively to the gate and source of FET 32.

The on drive pulse is applied to the gate of FET 31 by way of terminals 1 and 2. The drive pulse charges the gate-to-source capacitance of FET 31 and diode 71 holds the charge after the drive pulse ends. Resistor 41 provides a maximum dc resistance between gate to source. The total gate to source capacitance in conjunction with resistor 41 allows the gate to source voltage to maintain the on condition for at least 60 $\mu$sec after the 100 to 200 nanosecond drive pulse.

The on pulse also drives FET 33 by way of a second winding through terminals 5 and 6. This drive maintains a very low impedance from gate to source of FET 32 while the drain voltage of FET 32 is being increased with the output pulse. This low impedance prevents FET 32 from being turned on by capacitance from gate to drain.

The off pulse drives FET 32 by way of terminals 3 and 4. FET 32 is only on for the length of the off drive pulse. Its function is to rapidly return the grid to the bias level. The maintenance of the bias level is done through resistor 46. FET 32 also removes the drive from FET 31 by pulling the grid negative through diode 75.

The function of voltage regulators 52 to 56 is to protect the gate to source junction of the FET's. The spark gap 40 protects the modulator when the tube arcs and the capacitors 61 and 62 provide the peak currents necessary to get the fast rise and fall times required. Resistor 45 provides damping and limits peak current when tube arcs occur.

Figure 3:
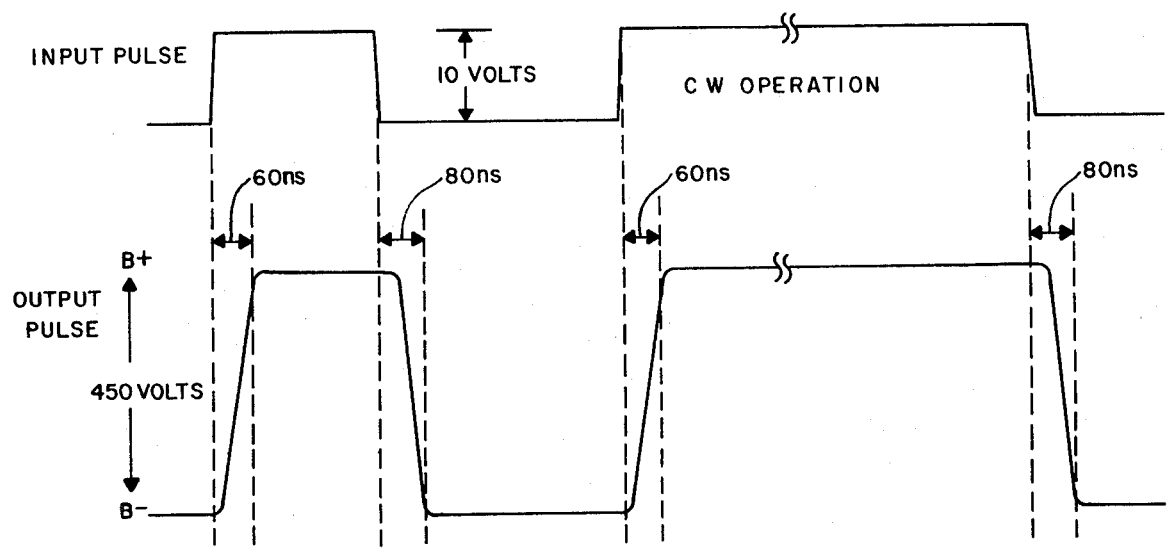

The timing diagram for input and output is shown in FIG. 3 and gives some indication of the flexibility of this unique design.

PREFERRED EMBODIMENTS

Figure 5:
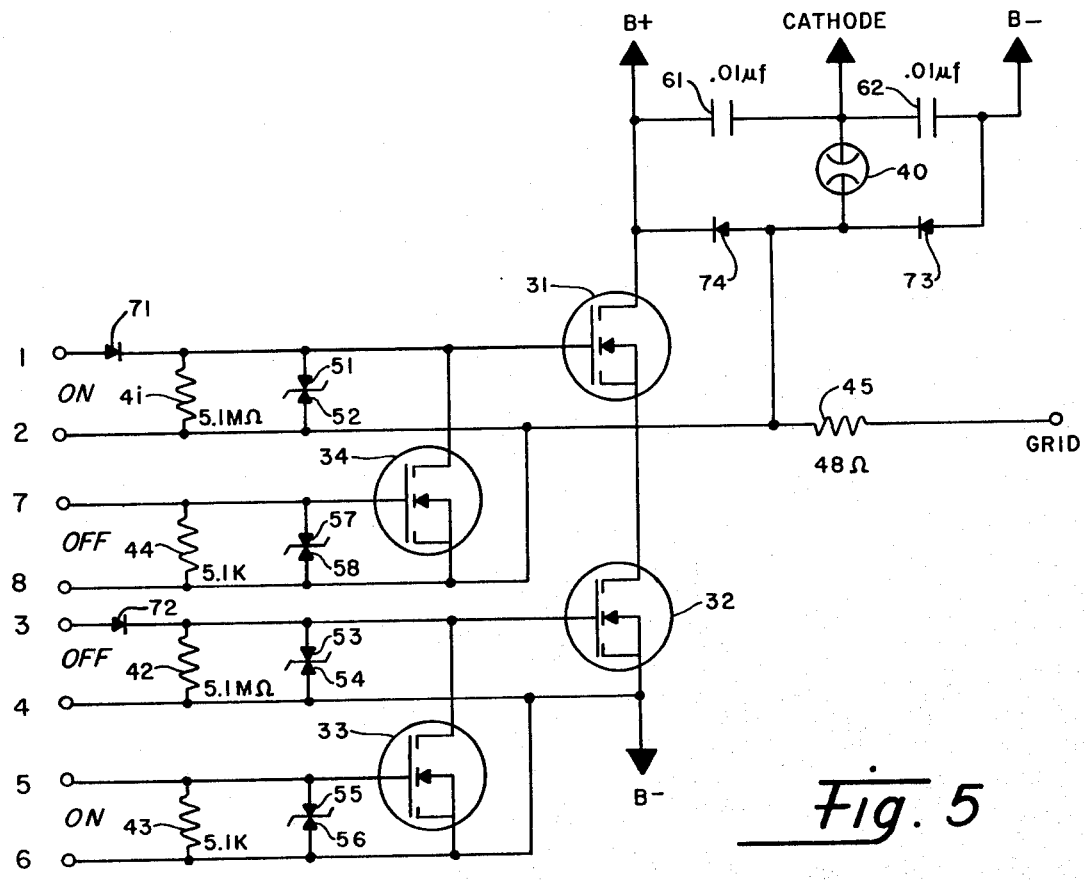
FIG. 5 is a schematic diagram of an embodiment of the high voltage portion, used with FIG. 4.
Figure 4:
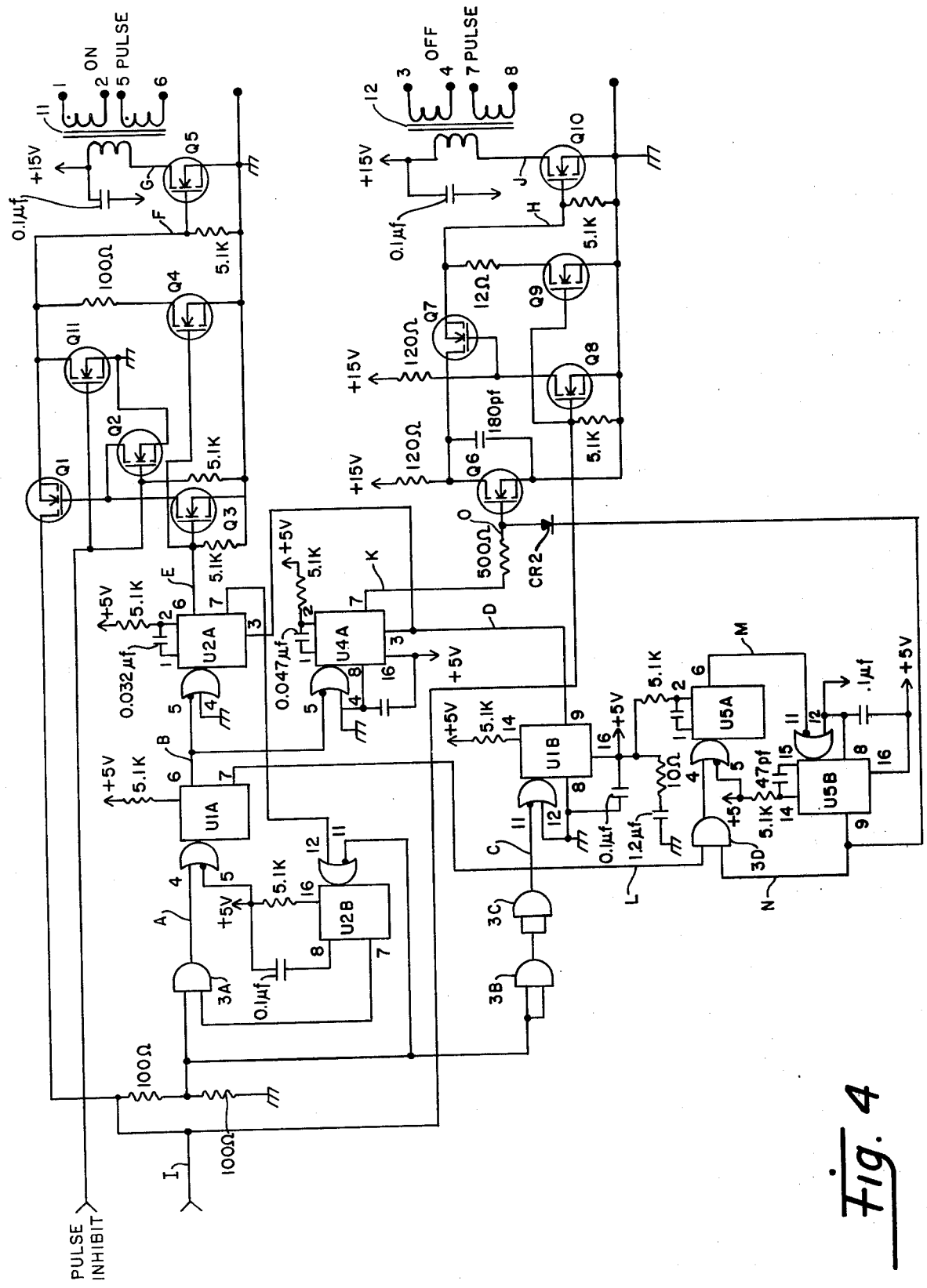
FIG. 4 is a detailed functional block and schematic diagram of the low voltage portion of one embodiment of the invention.

FIGS. 4 and 5 show specific details of one embodiment of the low voltage and high voltage portions respectively for the modulator. There are also some modifications with respect to FIG. 1.

The one shot devices 1A, 1B, 2A, 2B and 4A of FIG. 1 are shown in FIG. 4 as type 9602 devices U1A, U1B, U2A, U2B and U4A with associated timing and bias circuits. Added devices U5A and U5B are also type 9602. The electronic switching circuits represented in FIG. 1 as switches 20, 22, 24, 26 and 28 are shown implemented in FIG. 4 by FET's Q1 to Q11 inclusive. These FET's as well as FET's 33 and 34 of FIG. 5 may be type VN98AK available from Siliconics. The AND gates 3A, 3B, 3C and 3D comprise one device type 5408. The diode CR2, as well as diodes 71 and 72 of FIG. 5 may be type IN4148.

In FIG. 5, the high voltage FET's 31 and 32 may be type IRF 430. The voltage regulators 51 to 58 are type IN758, and diodes 73 and 74 are type IN5619.

In the high voltage portion of the modulator, there are two improvements shown in FIG. 5 with respect to FIG. 1. The first involves the turn off circuitry for FET 31. An FET 34 is added with a function similar to that performed by FET 33. This requires an additional winding with terminals 7 and 8 on transformer 12, which is no problem. Resistor 44 and voltage regulators 57 and 58 are connected between terminals 7 and 8. Diode 75 is deleted and the drain of FET 32 is connected to the source of FET 31. The reason for this change is that it provides better and quicker turn off of FET 31 which limits the shoot-through current during modulator turn off to a much lower value.

The second change also involves a change on the low voltage portion. On the high voltage portion the 10,000-ohm resistor 46 is deleted because at high duties (long on times) the full 450 volts would be applied across resistor 46 and it would dissipate an excessive amount of power. The design function of resistor 46 was to maintain bias on the traveling wave tube grid during off time. First the on drive of FET 32 was changed to a peak charge circuit, the same as the on drive for FET 31, and secondly an oscillator formed with one shot devices U5A and B and the associated circuitry was added to the low voltage portion as shown in FIG. 4 to provide a continuous stream of pulses at approximately 5 kilohertz when the modulator has been commanded to the off position. This maintains the drive to FET 32 whenever the modulator is in the off condition. The timing for this operation is shown in FIG. 2 on lines L, M, N and O. Line L is connected from the $\bar{Q}$ output of one-shot device U1A, via AND gate 3D to the leading edge input of one shot device U5A. Therefore, the signal on line L is the inverse of that on line B, and device U5A sets at the same time as device U2A. Device U5A has a timing period of about 200 microseconds, and resets itself at time T5, causing its Q output at line M to go low. Line M is connected to the trailing edge input of one shot device U5B, which therefore sets very shortly after time T5. The $\bar{Q}$ output of device U5B is connected via line N and AND gate 3D to device U5A, so that when device U5B resets after a short timing period, device U5A is again set at time T6 for another 200 $\mu$sec cycle. Line N is also connected via diode CR2 to line O. Note that the signal on line O is thus an OR function of the low level signals on lines K and N (equivalent to AND function for high levels). The pulse from line N via line O generates an off drive signal via line H and FET's Q6 to Q10 to line J.

CONCLUSION

The disclosed apparatus offers significant improvement in all areas and truly provides a quantum jump in modulation capability. Advantages of the design include the following:

Small size—both the low and high voltage portions of the design can be placed in 10-pin PHP (power hybrid packages), and the isolation transformers are very small.

It can be used for any pulsewidth from 0.2 $\mu$sec to CW operation.

Very short (approximately 60 nsec) and predictable delays.

It can be used for radar modulator as well as ECM.

When higher voltage FET's become available, they can be plugged into the circuit with little or no redesign to provide better performance.

Design is simple and easy to build.

Can be used on CW transmitter to provide rapid look through capability required for future applications. Thus, while preferred constructional features of the invention are embodied in the structure illustrated herein, it is to be understood that changes and variations may be made by the skilled in the art without departing from the spirit and scope of my invention.

I claim:

1. A modulator for a high voltage electron tube having a control grid, said modulator comprising a high voltage portion, a low voltage portion, and first and second transformers coupling the high and low voltage portions;

said first and second transformers each having a primary winding and at least one secondary winding, each winding having a very low number of turns; said high voltage portion comprising first and second transistors which are high voltage field effect transistors each having a source, a drain and a gate, one secondary winding of each of the first and second transformers being connected respectively to input circuits between the gate and the source of said first and second transistors, a diode being connected between the first transformer and the gate in the input circuit of the first transistor so that an on drive pulse applied via the first transformer charges the gate capacitance of the first transistor to bias it on, the charge being held by the diode, the source and drain of the first transistor being connected so that when the first transistor is on, bias is applied to the control grid for turning on the electron tube; off-drive means including the second transistor coupled between the second transformer, the first transistor, and the electron tube circuit so that responsive to an off-drive pulse at the second transformer the first transistor and the electron tube are turned off; and means connected to maintain off bias on the control grid during off times; said low voltage portion comprising on-control means and off-control means coupled between a source of input pulses and the primary windings of said first and second transformers, the on-control means comprising initial means responsive to the beginning of an input pulse to substantially immediately apply an on-drive pulse of short duration via the first transformer, and regeneration means having timing means with a given time interval for generating, via the first transformer repeated on-drive pulses spaced by said given time interval for the duration of the input pulse; the off-control means comprising means responsive to the trailing edge of an input pulse to apply an off-drive pulse of short duration via the second transformer.

2. A modulator according to claim 1, wherein said on-control means and off-control means each include delay means for determining the short duration respectively of the on-drive and off-drive pulses, and wherein said timing means comprises a one-shot device.

3. A modulator according to claim 2, wherein in said on-control means said delay means includes an AND gate and a one-shot device with a very short timing period coupled in series between said source and an input of said timing means one shot device, which sets after said short duration; first switching means; said initial means being a direct connection from said source to the first switching means to close a circuit to the primary winding of the first transformer, a connection from an output of the timing means one shot such that responsive to setting of the timing means one shot the first switching means opens the circuit to the first transformer primary winding; and said regeneration means includes a one shot device coupled between an output of the timing means one shot and an input of said AND gate.

4. A modulator according to claim 3, wherein said off-control means includes second switching means, a connection from said source to the second switching means to close a connection to the primary winding of the second transformer in response to the absence of an input signal, to thereby start an off-drive pulse, an off-timing one shot having a timing period slightly greater than that of said timing means one shot of the on-control means, the timing means one shot and the off-timing one shot having their inputs in parallel to be set at the same time, said delay means of the off-control means comprising gate means and a delay one shot device connected in tandem to said source, an output of the delay one shot device being connected to reset inputs of the timing means one shot device and of the off-timing one shot device, and an output of the off-timing one shot being connected to the second switching means to open the connection to the primary winding of the second transformer to end the off-drive pulse, and wherein the first and second switching means each comprise a pulrality of field effect transistors.

5. A modulator according to claim 1 or 4, wherein the high voltage portion includes a third transistor of the field effect type, the first transformer has another secondary winding connected to an input circuit to the gate and source of the third transistor, the drain and source of the third transistor being connected to the gate and source of the second transistor so that during on-drive pulses their is a low impedance shunt across the input of the second transistor.

6. A modulator according to claim 5, wherein the high voltage portion further includes a fourth transistor of the field effect type, the second transformer has another secondary winding connected to an input circuit to the gate and source of the fourth transistor, the drain and source of the fourth transistor being connected to the gate and source of the first transistor so that during off-drive pulses their is a low impedance shunt across the input of the first transistor; the drain of the second transistor being connected to the source of the first transistor.

7. A modulator according to claim 6, wherein the high voltage portion further includes a diode connected between the second transformer and the gate in the input circuit of the second transistor so that an off-drive pulse applied via the second transformer charges the gate capacitance of the second transistor to bias it on, the charge being held by the diode;

wherein the low voltage portion includes an oscillator comprising two one shot devices, the oscillator having a connection to an output of the delay means of the on-control means to start it, and an output to the second switching means, to provide a continuous stream of off-drive pulses at a predetermined frequency during intervals when the modulator has been commanded to the off condition by the absence of an input signal at said source.

* * * * *